(12) United States Patent
Hasegawa et al.

(10) Patent No.: US 6,353,559 B2
(45) Date of Patent: *Mar. 5, 2002

(54) WRITE CIRCUIT FOR A SEMICONDUCTOR MEMORY DEVICE

(75) Inventors: Kazuhiro Hasegawa, Gifu-ken; Akira Yoneyama, Gunma-ken, both of (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,589

(22) Filed: Feb. 2, 1999

(30) Foreign Application Priority Data

| Feb. 19, 1998 | (JP) | .......... 10-037348 |
| Feb. 27, 1998 | (JP) | .......... 10-047587 |
| Feb. 27, 1998 | (JP) | .......... 10-047588 |
| Aug. 25, 1998 | (JP) | .......... 10-239062 |

(51) Int. Cl.⁷ .............................................. G11C 16/04
(52) U.S. Cl. ...................... 365/189.09; 365/189.11; 365/189.18; 365/226
(58) Field of Search ................... 365/189.09, 189.11, 365/189.18, 226

(56) References Cited

U.S. PATENT DOCUMENTS

| 5,446,418 A | * | 8/1995 | Hara et al. ............. 365/189.09 |
| 5,615,146 A | | 3/1997 | Gotou ................... 365/185.01 |
| 5,661,686 A | | 8/1997 | Gotou ................... 365/185.23 |
| 5,889,719 A | * | 3/1999 | Yoo et al. .................... 365/226 |
| 5,969,565 A | * | 10/1999 | Naganawa ................... 365/226 |
| 5,991,221 A | * | 11/1999 | Ishikawa et al. ............ 365/226 |

FOREIGN PATENT DOCUMENTS

EP 0 710 959 A2 5/1996

* cited by examiner

*Primary Examiner*—Richard Elms
*Assistant Examiner*—VanThu Nguyen
(74) *Attorney, Agent, or Firm*—Fish & Richardson P.C.

(57) ABSTRACT

A write circuit supplies a write potential that is higher than a power supply potential to memory cells of a semiconductor memory device. The write circuit includes a reference potential generator that generates a reference potential having a substantially constant potential difference from one of a power supply potential and a ground potential. A voltage-controlled oscillator (VCO) connected to the reference potential generator receives the reference potential and generates an oscillation clock signal in proportion to the reference potential. A booster connected to the VCO generates the write potential by piling up the oscillation clock signal onto the power supply potential in a multistage manner. A write controller is connected to the booster and supplies the write potential to the memory cells in accordance with a write clock.

11 Claims, 7 Drawing Sheets

WRITE CIRCUIT FOR A SEMICONDUCTOR MEMORY DEVICE

BACKGROUND OF THE INVENTION

The present invention generally relates to a write circuit for a semiconductor memory device, and more particularly, to the stabilization of the write potential supplied to a memory cell transistor of a semiconductor memory device.

An Electrically Erasable and Programmable ROM (EEPROM) is equipped with a memory cell transistor with a double gate structure consisting of a floating gate and a control gate. In data writing of the memory cell transistor, some hot electrons that move from a drain region to a source region are injected into the floating gate. In data reading, the differences between the operating characteristics of a memory cell when electric charge is injected into the floating gate and the operating characteristics of the memory cell when the electric charge is not injected into the floating gate are detected. In other words, changes in the threshold of the memory cell are detected.

FIG. 1 is a schematic block diagram of a conventional semiconductor memory device. In this diagram, the memory device has four rows and one column. However, it is well known in the art that memory cell transistors can be arranged over plural rows and columns.

A memory cell transistor 1 has an electrically independent floating gate and a control gate having a portion that covers the floating gate. The memory cell transistor I turns on and off in accordance with a potential applied to the control gate and changes its own threshold in accordance with the amount of electric charge accumulated in the floating gate.

The control gate of the memory cell transistor 1 of each row is connected to a word line 2 provided on each row, respectively. The drain of the memory cell transistor 1 in one column is connected to a sense amp (not illustrated) via a common bit line 3. The source of each memory cell transistor 1 is connected to a source line 4 arranged between the respective memory cell transistors 1.

A row decoder 5 receives row address information and generates row selection signals LS1 to LS4 that selectively activate any one of the four word lines 2 in accordance with a selection clock signal φL. The selection signals LS1 to LS4 are supplied to the memory cell transistors 1 through the word lines 2 and the control gate of the selected memory cell transistor 1 is turned on. If the memory cell transistors 1 are arranged over plural columns, a column decoder that selects one column is used in accordance with column address information. Thus, the one memory cell transistor 1 selected in accordance with the low address information (and the column address information) is connected to the sense amp.

A read controller 6 is connected to the bit line 3 and supplies a read potential Vd1 to the bit line 3 in accordance with a read clock signal φR. A write controller 7 is connected to the source line 4 and supplies a write potential Vd2 to the source line 4 in accordance with a write clock signal φW. The read controller 6 and the write controller 7 supply a ground potential Vs, except during the periods in which the read potential Vd1 and the write potential Vd2 are supplied.

In data writing, the ground potential Vs (for example, 0 V) is applied to the drain of the memory cell transistor 1 through the bit line 3, and the write potential Vd2 (for example, 14 V) is applied to the source of the memory cell transistor 1 through the source line 4. Accordingly, in the selected memory cell transistor 1, write current flows from the source region to the drain region and an electric charge is injected into the floating gate.

In data reading, the read potential Vd1 (for example, 5 V) is applied to the drain of the memory cell transistor 1 through the bit line 3, and the ground potential Vs (for example, 0 V) is applied to the source of the memory cell transistor 1 through the source line 4. Accordingly, in the selected memory cell transistor 1, read current flows from the drain region to the source region. At this time, the memory cell transistor 1 has a threshold that corresponds to the amount of electric charge (i.e., write information) accumulated in the floating gate. Consequently, the potential of the bit line 3 that corresponds to the threshold is read using the sense amp.

In data writing, as the amount of electric charge injected into the floating gate of the memory cell transistor 1 increases, the threshold change of the memory cell transistor 1 increases. As a result, in data reading, the write data is more easily determined. However, increasing the amount of electric charge prolongs the write time. Accordingly, it is not desirable to inject more electric charge into the floating gate than is necessary. In general, the minimum amount of electric charge is injected into the floating gate such that a sufficient change of threshold to determine the write data can be obtained.

Because the write potential Vd2 is higher than the normal power supply potential, the high potential Vhv generated using a booster (not illustrated) is supplied to the write controller 7, and the write potential Vd2 is supplied to the source line 4 by the write controller 7. Accordingly, the current flowing in the memory cell transistor 1 is determined according to the current supply capacity of the booster. Further, the amount of electric charge injected into the floating gate is controlled by the amount of current flowing in the memory cell transistor 1 and the current flow time. If the booster operates unstably due to factors such as fluctuations of the power supply potential, the current flowing in the memory cell transistor 1 fluctuates. Consequently, the amount of electric charge injected into the floating gate fluctuates.

It is an object of the present invention to provide a write circuit for a semiconductor memory device that stably writes data into a memory cell transistor.

SUMMARY OF THE INVENTION

Briefly stated, the present invention provides a write circuit for supplying a write potential that is higher than a power supply potential to memory cells of a semiconductor memory device. The device includes a reference potential generator that generates a reference potential having a substantially constant potential difference from one of a power supply potential and a ground potential. A voltage-controlled oscillator (VCO) connected to the reference potential generator receives the reference potential and generating an oscillation clock signal having an oscillation clock frequency in proportion to the reference potential. A booster connected to the VCO that generates a write potential by piling up the oscillation clock signal onto the power supply potential in a multistage manner. A write controller is connected to the booster and supplies the write potential to the memory cells in accordance with a write clock.

The present invention provides a method of generating a write potential that is higher than a power supply potential to memory cells of a semiconductor memory device. First, a reference potential is generated that has a substantially constant potential difference from one of a power supply potential and a ground potential. Then, an oscillation clock signal having an oscillation clock frequency is generated in proportion to the reference potential. A write potential is generated by piling up the oscillation clock signal onto the power supply potential in a multistage manner. Then, the write potential is supplied to the memory cells in accordance with a write clock.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together the accompanying drawings in which.

DETAILED DESCRIPTION OF THE PREFERRED EMBODIMENTS

Figure 1:
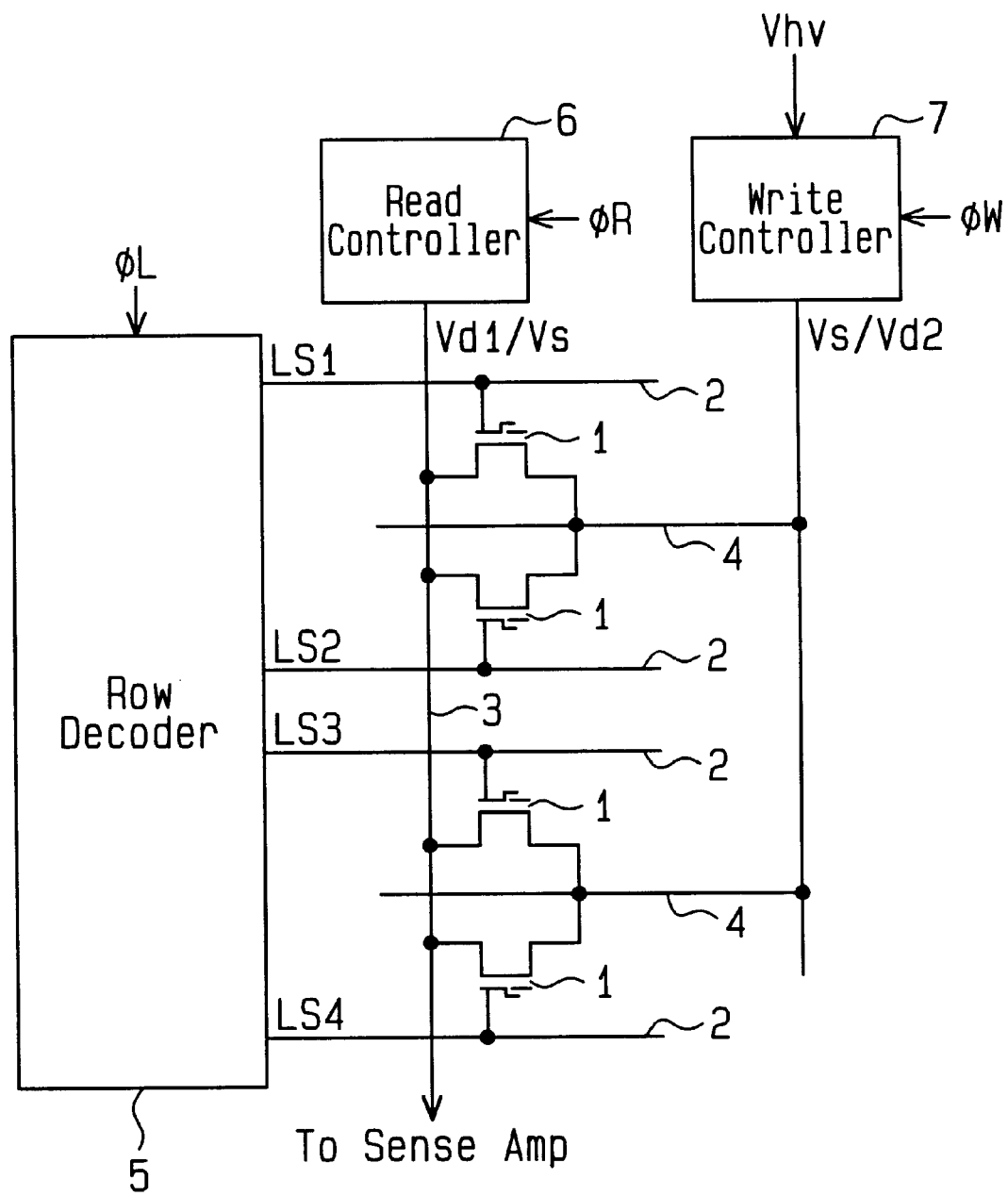
FIG. 1 is a schematic block diagram of a conventional nonvolatile semiconductor memory device.

In the drawings, like numerals are used for like elements throughout.

First Embodiment

Figure 2:
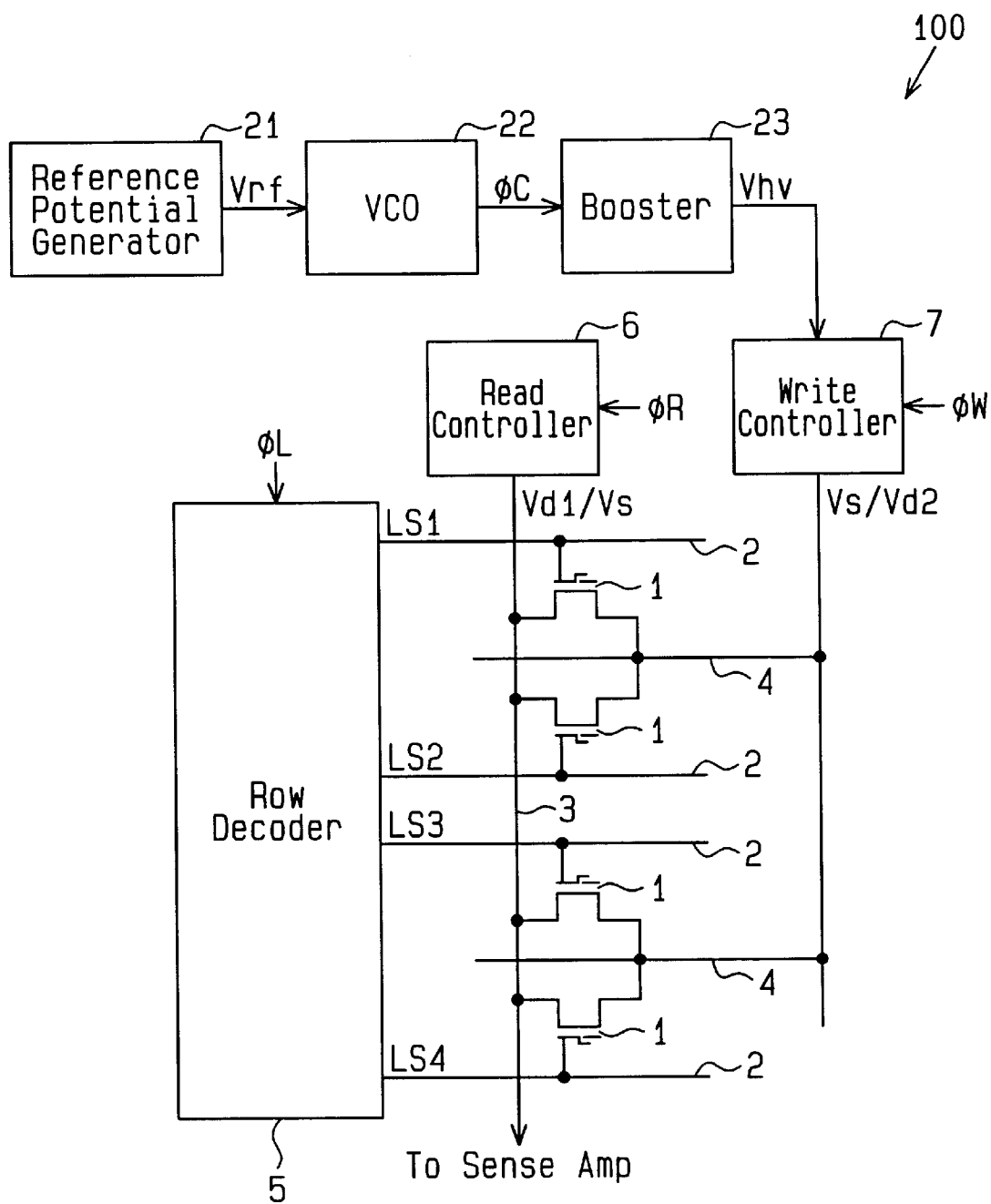
FIG. 2 is a schematic block diagram of a nonvolatile semiconductor memory device according to a first embodiment of the present invention.

FIG. 2 is a schematic block diagram of a nonvolatile semiconductor memory device 100 according to a first embodiment of the present invention. The nonvolatile semiconductor memory device 100 is equipped with the memory cell transistors 1, the word lines 2, the bit line 3, the source lines 4, the row decoder 5, the read controller 6, the write controller 7, a reference potential generator 21, a voltage-controlled oscillator (VCO) 22, and a booster 23.

The reference potential generator 21 generates a reference potential Vrf and supplies the reference potential Vrf to the voltage-controlled oscillator (VCO) 22. The reference potential Vrf always has a constant potential difference from the ground potential or power supply potential.

The voltage-controlled oscillator (VCO) 22 is preferably a ring oscillator having a negative feedback loop, and varies the frequency of an oscillation clock signal φc by fluctuating the delay time of the negative feedback loop in response to the reference potential Vrf.

The booster 23 generates the high potential Vhv that is higher than the power supply potential by laying or piling up the waveform of the oscillation clock signal φc from the VCO 22 onto the power supply potential in a multistage manner and supplies the high potential Vhv to the write controller 7. The write controller 7 supplies the high potential Vhv to the source line 4 as the write potential Vd2 in accordance with the write clock signal φw.

Because the reference potential Vrf maintains a substantially constant potential difference from and the power supply potential or ground potential, the VCO 22 generates the oscillation clock signal φc having a constant or substantially constant frequency. The booster 23 generates the high potential Vhv in accordance with the oscillation clock signal φc. In other words, the current supply capacity of the booster 23 is determined according to the frequency of the oscillation clock signal φc. Accordingly, while the reference potential Vrf is maintained at the predetermined level, a substantially constant write current flows in the memory cell transistor 1. In other words, the operation of writing information to the memory cell transistor 1 is made stable by the write controller 7.

Figure 3:
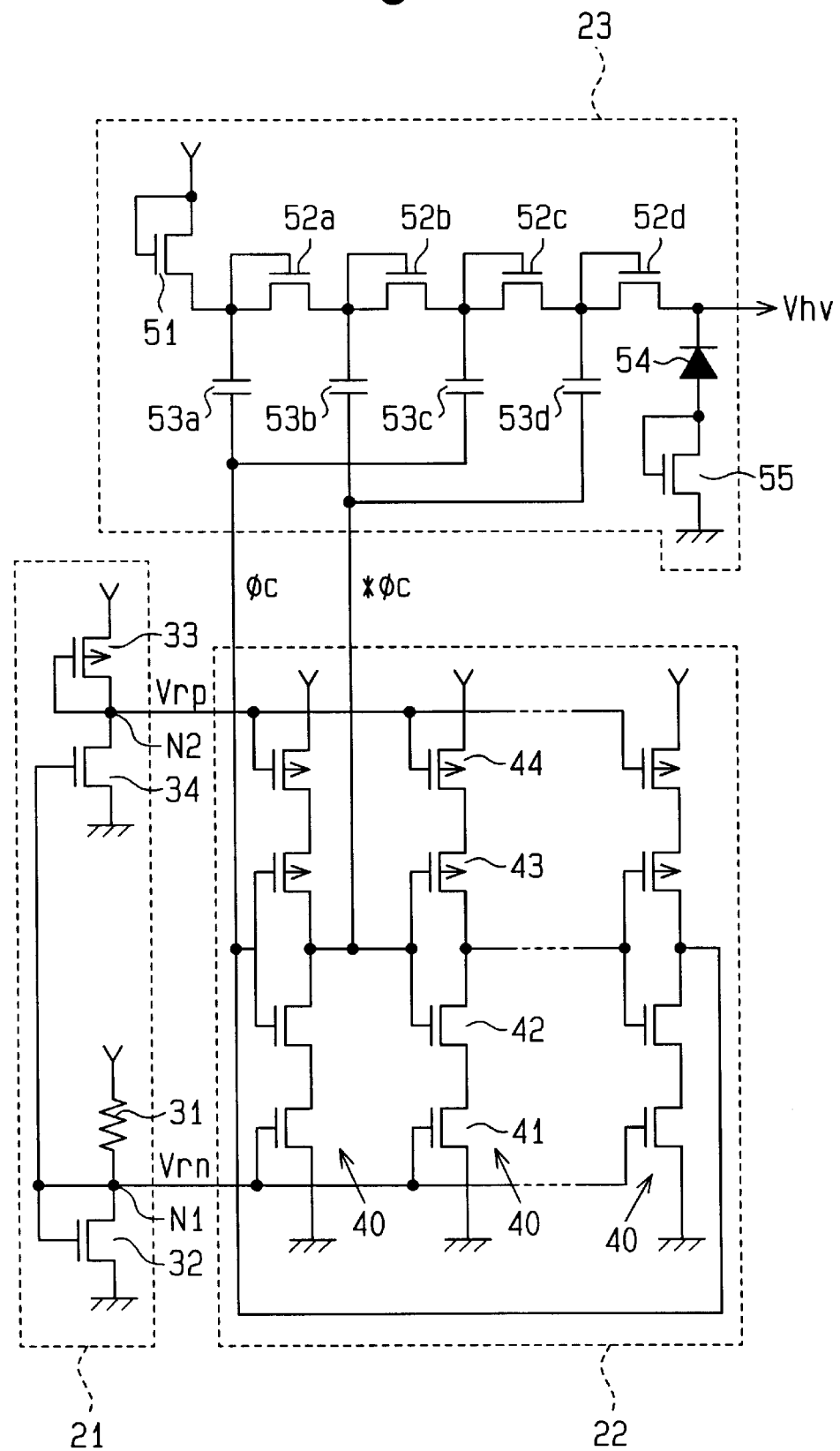
FIG. 3 is a circuit diagram of a write circuit for the memory device of FIG. 2.

FIG. 3 is a circuit diagram illustrating the reference potential generator 21, the VCO 22, and the booster 23 of FIG. 2.

The reference potential generator 21 is equipped with a resistor 31, an N-channel type MOS transistor 32, a P-channel type MOS transistor 33, and an N-channel type MOS transistor 34. The resistor 31 and the transistor 32 are connected in series between the power supply potential and ground potential, and a node N1 between the resistor 31 and the transistor 32 is connected to the gate of the transistor 32. A pair of transistors 33 and 34 are connected in series between the power supply potential and the ground potential and a node N2 between both the transistors 33 and 34 is connected to the gate of the transistor 33. Further, the gate of the transistor 34 is connected to the node N1. The transistors 33 and 34 form a current mirror for the resistor 31 and the transistor 32. The potential between the resistor 31 and the transistor 32 is output from the node N1 as the first reference potential Vrn, and the potential between the transistors 33 and 34 is output from the node N2 as the second reference potential Vrp.

The first reference potential Vrn is determined according to the resistance ratios of the resistor 31 and the transistor 32 and maintains a substantially constant potential difference from the first reference potential Vrn and the power supply potential. The second reference potential Vrp is determined according to the resistance ratios of the transistors 33 and 34 and has a substantially constant potential difference from the power supply potential.

The VCO 22 is equipped with inverters 40 connected at odd stages and in series, and the output of the final stage inverter 40 is fed back to the input of the first stage inverter 40 to form a ring oscillator. Each of the inverters 40 includes two N-channel type MOS transistors 41 and 42 and two P-channel type MOS transistors 43 and 44. The transistors 41 and 42 and the transistors 43 and 44 are connected in series between the power supply potential and ground potential. The gates of the transistors 42 and 43 are the input terminals of the inverter 40, and the node between the transistors 42 and 43 is the output terminal of the inverter 40. The first reference potential Vrn is applied to the gate of each of the transistors 41 and the second reference potential Vrp is applied to the gate of each of the transistors 44. Accordingly, the delay time of the inverter 40 is controlled according to the potential difference between the first reference potential Vrn and ground potential and the potential difference between the second reference potential Vrp and the power supply potential.

Because the first reference potential Vrn and the second reference potential Vrp maintain a substantially constant potential difference from the ground potential and the power supply potential, respectively, the delay time of each inverter 40 is maintained substantially constant. Thus, the oscillation clock signal φc having the substantially constant oscillation frequency controlled by the first and second reference potential Vm, Vrp is output from the input of the first stage inverter 40, and the inverse clock signal *φc is output from the node between the first and second inverters 40.

The booster 23 is equipped with an N-channel type MOS transistor 51, four series connected N-channel type MOS transistors 52a to 52d, four capacitors 53a to 53d, a diode 54, and an N-channel type MOS transistor 55. The transistor 51 has a drain and a gate connected to the power supply. The drain of the first stage transistor 52a is connected to the source of the transistor 51, and the source of the fourth stage transistor 52d is connected to the output terminal of the booster 23.

The first and third stage capacitors 53a and 53c have first terminals connected to the drains and gates of the first and third stage transistors 52a and 52c respectively, and second terminals that receive the oscillation clock signal φc. The second and fourth stage capacitors 53b and 53d have first terminals connected to the drains and gates of the second and fourth stage transistors 52b and 52d, respectively, and second terminals that receive the inverse clock signal *φc.

The diode 54 has an anode connected to the source of the fourth stage transistor 52d and a cathode connected to the drain of the transistor 55. The transistor 55 is connected between the cathode of the diode 54 and the ground potential, and its gate is connected to its drain. The diode 54 and the transistor 55 form a limiter that prevents the high potential Vhv from exceeding the predetermined potential.

A potential lower than the power supply potential by the threshold of the transistor 51 is applied to the drain of the first stage transistor 52a, and the electric charge is accumulated in the first stage capacitor 53a. At this time, when the oscillation clock signal φc having a low level is applied, the first and third stage transistors 52a and 52c turn off. Subsequently, when the oscillation clock signal φc and the inverse clock signal *φc are reversed and high and low level signals are applied, the first and third stage transistors 52a and 52c turn on and the second and fourth stage transistors 52b and 52d turn off. Hereupon, the electric charge accumulated in the first stage capacitor 53a moves to the second stage capacitor 53b. At this time, because the oscillation clock signal φc has the high level, the electric charge that corresponds to the higher potential by the peak value of the oscillation clock signal φc is accumulated in the second stage capacitor 53b. When the potential of the first stage capacitor 53a is higher than the potential, which is lower than the power supply potential by the threshold of the transistor 51, the transistor 51 turns off and the supply of the power supply potential is stopped.

By repeating the reverse of the oscillation clock signal φc and inverse clock signal *φc, the electric charge sequentially moves from the second stage capacitor 53b to the fourth stage capacitor 53d, and the peak value of the oscillation clock signal φc or inverse clock signal *φc is sequentially added. Then, the high potential Vhv that corresponds to the accumulated peak for the four stages is output from the booster 23. Accordingly, the current supply capacity of the booster 23 is determined according to the frequencies of the oscillation clock signal φc and the inverse clock signal *φc.

When the high potential Vhv exceeds the total voltage of the breakdown voltage of the diode 54 and the threshold voltage of the transistor 55, current flows into the ground through the diode 54 and the transistor 55. Accordingly, the high potential Vhv is limited to the predetermined potential.

The write controller 7 receives the high potential Vhv from the booster 23 and applies the write potential Vd2 to the selected memory cell transistor 1. Thus, the constant write potential Vd2 is applied to the selected memory cell transistor 1 and the constant current flows to the selected memory cell.

Second Embodiment

Figure 4:
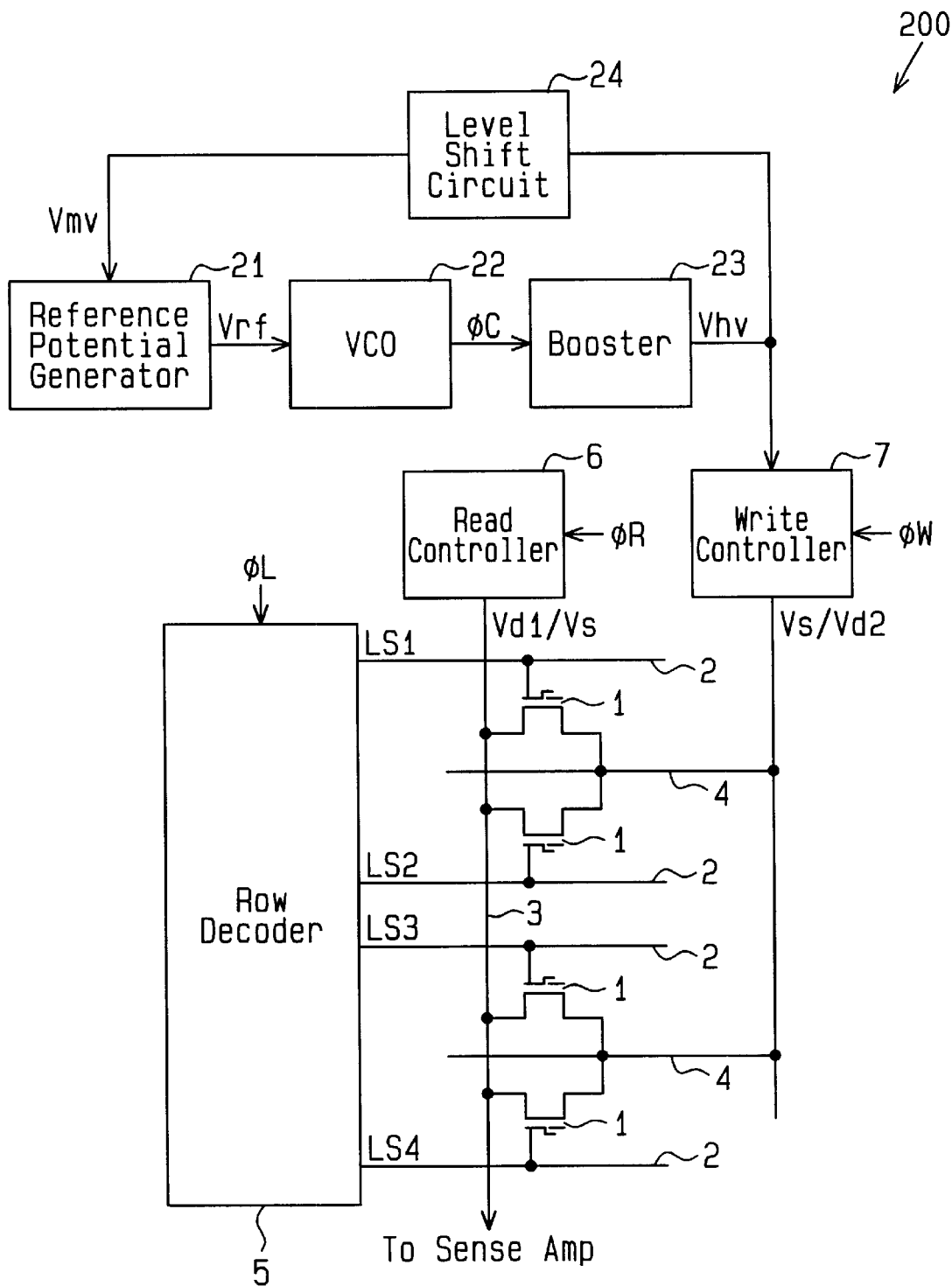
FIG. 4 is a schematic block diagram of a nonvolatile semiconductor memory device according to a second embodiment of the present invention.

FIG. 4 is a schematic block diagram of a nonvolatile semiconductor memory device 200 according to a second embodiment of the present invention. The nonvolatile semiconductor memory device 200 is equipped with the memory cell transistors 1, the word lines 2, the bit line 3, the source lines 4, the row decoder 5, the read controller 6, the write controller 7, the VCO 22, the booster 23, a level shift circuit 24, and a reference potential generator 25.

The reference potential generator 25 generates a reference potential Vrf having a substantially constant potential difference from the ground potential or power supply potential and supplies the reference voltage Vrf to the voltage-controlled oscillator 22. The reference potential generator 25 changes or corrects the reference potential Vrf in accordance with an intermediate potential Vmv supplied from the level shift circuit 24 described below.

The level shift circuit 24 receives the high potential Vhv from the booster 23 and shifts the level of the high potential Vhv to a level that is lower than the power supply potential to generate the intermediate potential Vmv. In other words, the level shift circuit 24 generates the intermediate potential Vmv that follows the fluctuation of the high potential Vhv and supplies intermediate potential Vmn to the reference potential generator 21.

The level of the high potential Vhv drops if the current supply capacity of the booster 23 is insufficient. In other words, when the level of the high potential Vhv drops, the reference potential generator 21 feeds back and controls the VCO. 22 so that the frequency of the oscillation clock signal φc increases based on the intermediate potential Vmn. This feedback control maintains the level of the high potential Vhv substantially constant.

Figure 5:
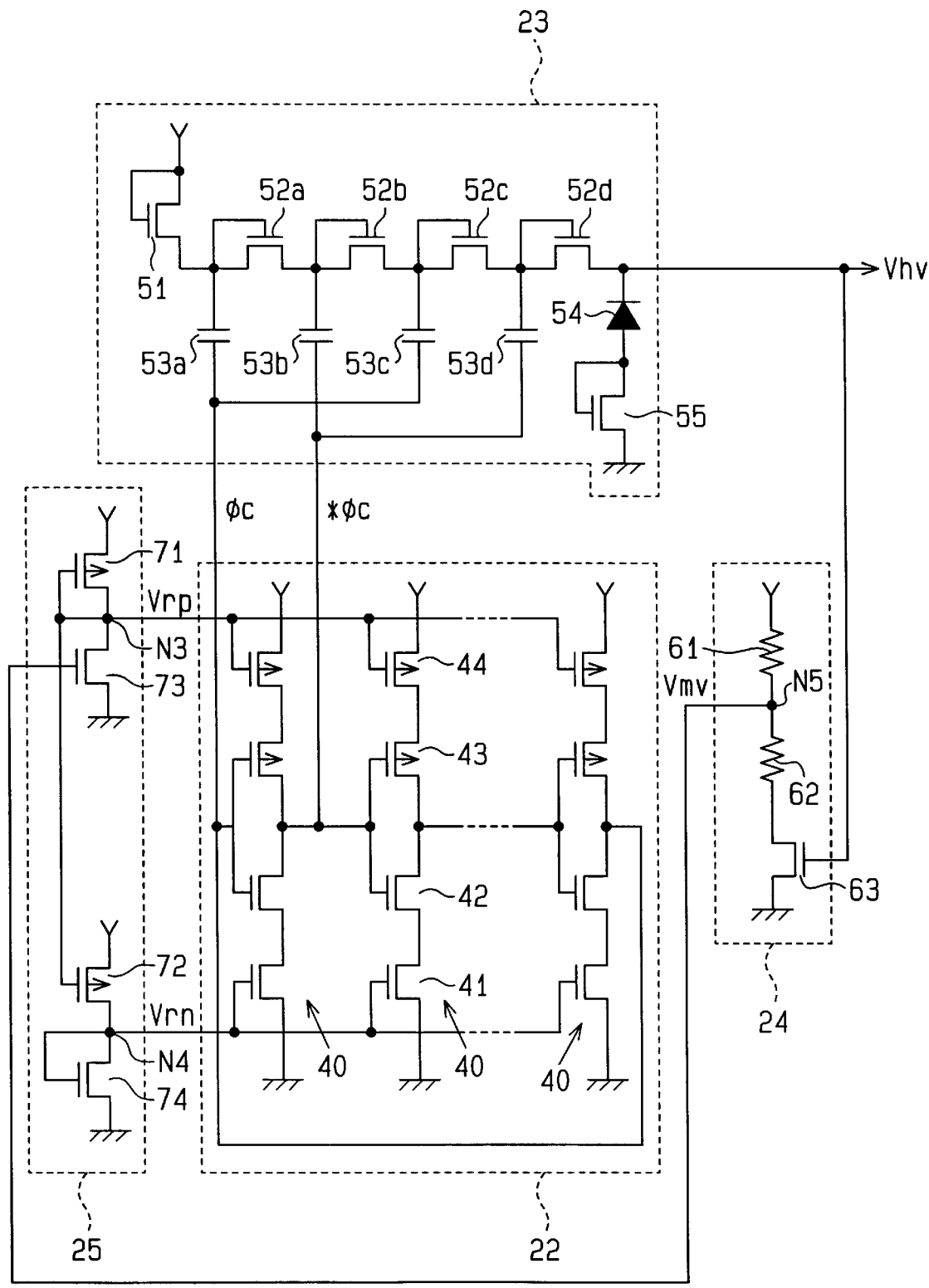
FIG. 5 is a circuit diagram of a write circuit of the memory device of FIG. 4.

FIG. 5 is a circuit diagram of the VCO. 22, the booster 23, the level shift circuit 24, and the reference potential generator 25 of FIG. 4.

The reference potential generator 25 is equipped with P-channel type MOS transistors 71 and 72 and N-channel type MOS transistors 73 and 74. The transistors 71 and 73 are connected in series between the power supply potential and ground potential and the intermediate potential Vmv from the level shift circuit 24 is applied to the gate of the transistor 73. The gate of the transistor 71 is connected to a node N3 between the transistors 71 and 73. The first reference potential Vrp is output from the node N3. The transistors 72 and 74 are connected in series between the power supply potential and ground potential, and the gate of the transistor 72 is connected to the node N3. The gate of the transistor 74 is connected to a node N4 between the transistors 72 and 74. The second reference potential Vrn is output from the node N4.

The level shift circuit 24 is equipped with two resistors 61 and 62 and an N-channel type MOS transistor 63. The resistors 61 and 62 and the transistor 63 are connected in series between the power supply potential and ground potential, and the high potential Vhv from the booster 23 is applied to the gate of the transistor 63. The intermediate potential Vmv is output from a node N5 between the resistors 61 and 62. The transistor 63 has a high-dielectric strength structure. Accordingly, even if the high potential Vhv is applied to the gate, no current leakage is generated. The resistances of the resistors 61 and 62 are set so that the intermediate potential Vmv between the ground potential and power supply potential is obtained in accordance with the high potential Vhv applied to the gate of the transistor 63.

In the level shift circuit 24, when the level of the high potential Vhv drops, the intermediate potential Vmv rises. In the reference potential generator 25, in accordance with the rise of the intermediate potential Vmv, the first reference potential Vrp drops and the second reference potential Vrn rises. Thus, the delay time of each inverter 40 in the VCO. 22 is decreased. Accordingly, the frequencies of the oscillation clock signal φc and inverse clock signal *φc increase and as a result, the current supply capacity of the booster 23 improves. Thus, the level of the high potential Vhv generated by the booster 23 is corrected.

Third Embodiment

Figure 6:
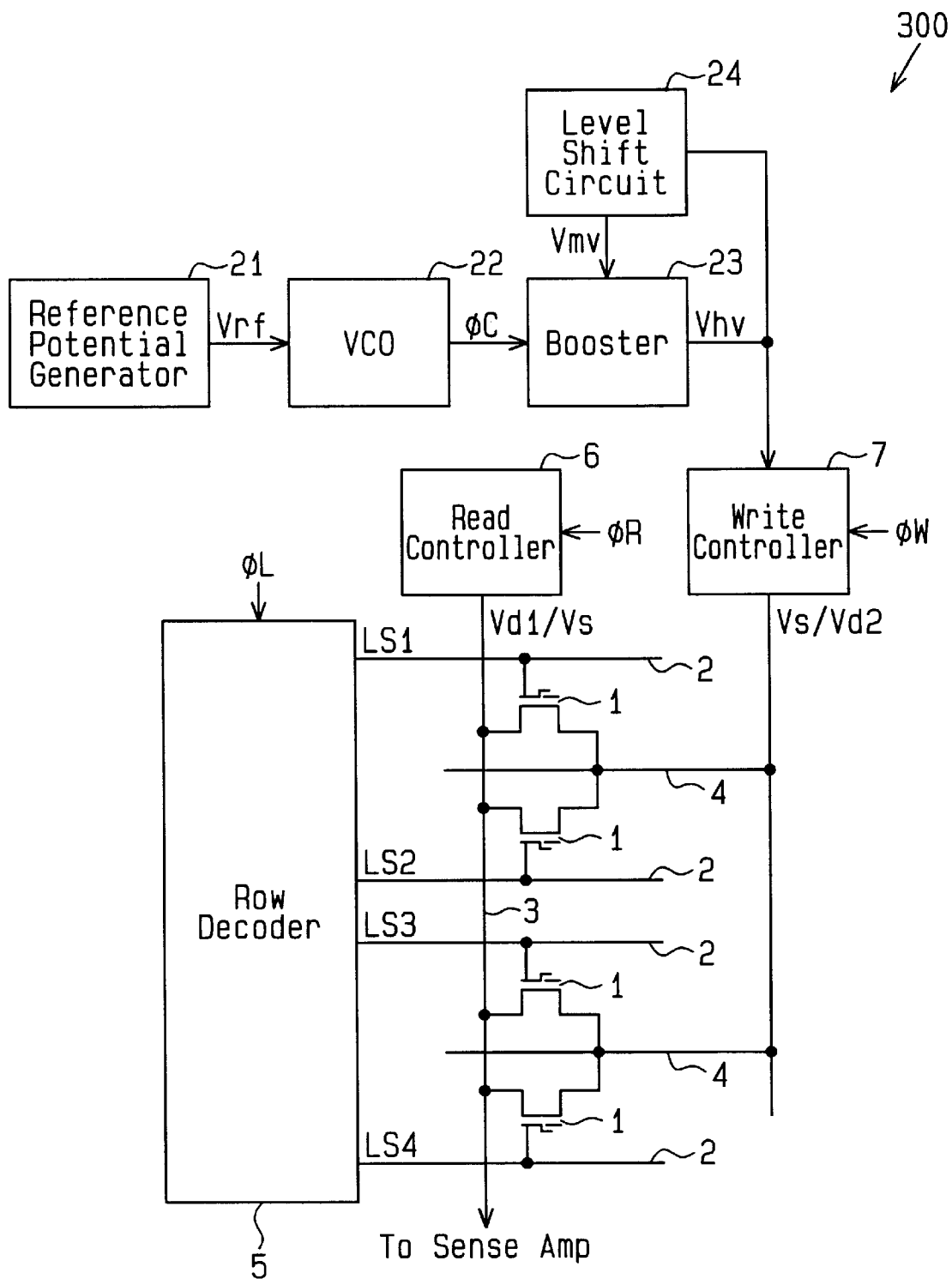
FIG. 6 is a schematic block diagram of a nonvolatile memory device according to a third embodiment of the present invention.

FIG. 6 is a schematic block diagram of a nonvolatile semiconductor memory device 300 according to a third embodiment of the present invention. The nonvolatile semiconductor memory device 300 is equipped with the memory cell transistors 1, the word lines 2, the bit line 3, the source lines 4, the row decoder 5, the read controller 6, the write controller 7, the reference potential generator 21, the VCO. 22, the level shift circuit 24, and a booster 26.

The booster 26 receives the intermediate potential Vmv from the level shift circuit 24 and sets the initial potential based on the intermediate potential. The booster 26 lays the peak value of the oscillation clock signal φc onto the initial potential and generates the high potential Vhv. In other words, when the level of the high potential Vhv drops and the intermediate potential Vmv rises, the booster 26 is designed so that the initial potential rises and the level drop of the high potential Vhv is compensated.

Figure 7:
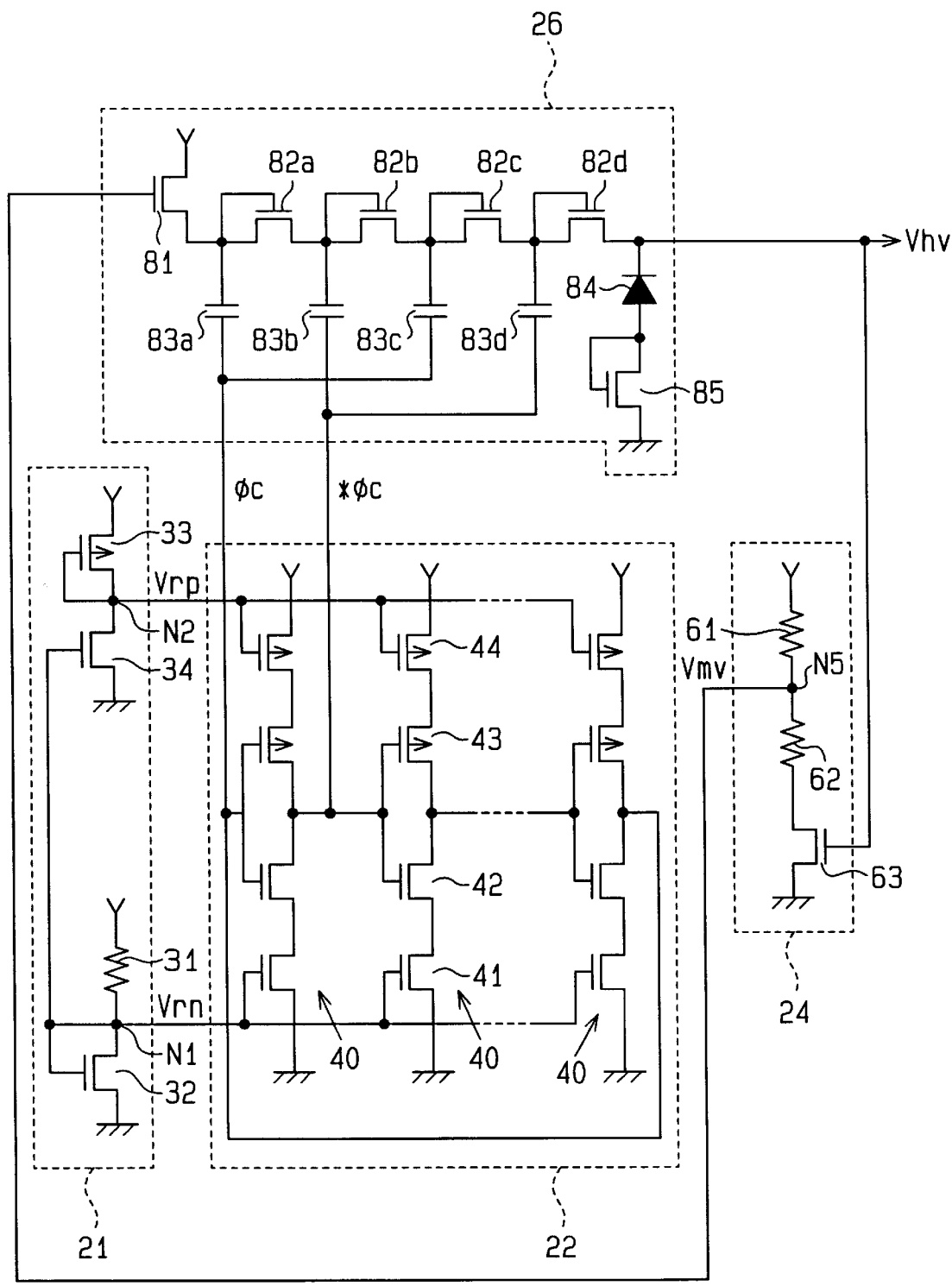
FIG. 7 is a circuit diagram of the write circuit of the memory device of FIG. 6.

FIG. 7 is a circuit diagram of the reference potential generator 21, VCO. 22, level shift circuit 24, and booster 26 of FIG. 6.

The booster 26 is provided with an N-channel type MOS transistor 81, four N-channel type MOS transistors 82a to 82d connected in series, four capacitors 83a to 83d, a diode 84, and an N-channel type MOS transistor 85. The intermediate potential Vmv from the level shift circuit 24 is applied to the gate of the transistor 81, and the drain of the transistor 81 is connected to a power supply.

The drain of the first stage transistor 82a is connected to the source of the transistor 81, and the source of the fourth stage transistor 82d is connected to the output terminal of the booster 26. The first and third stage capacitors 83a and 83c have first terminals connected to the drains of the first and third stage transistors 82a and 82c, respectively, and second terminals that receive the oscillation clock signal φc. The second and fourth stage capacitors 83b and 83d have first terminals connected to the drains of the second and fourth stage capacitors 83b and 83d, respectively, and second terminals that receives the inverse clock signal *φc.

The diode 84 has an anode connected to the source of the fourth stage transistor 82d and a cathode connected to the drain of the transistor 85. The transistor 85 is connected between the cathode of the diode 84 and ground potential and its gate is connected to its drain. The diode 84 and the transistor 85 form a limiter that prevents the high potential Vhv from exceeding the predetermined potential.

In the booster 26, first, a potential lower than the intermediate potential by the threshold of the transistor 81 is applied to the drain of the first stage transistor 82a, and the electric charge corresponding to the potential is accumulated in the first stage capacitor 83a. Then, while the oscillation clock signal φc and inverse clock signal *φc are repeatedly reversed and applied to the capacitors 83a to 83d, the electric charge sequentially moves from the first stage capacitor 83a to the fourth stage capacitor 83d. While the electric charge is moving, the peak value of the oscillation clock signal φc or inverse clock signal *φc is sequentially added and finally the high potential Vhv that corresponds to the accumulated peak value for the four stages is generated.

In the level shift circuit 24, when the high potential Vhv drops, the intermediate potential Vmv rises. Accordingly, the intermediate potential Vmv supplied to the transistor 81 of the booster 26, i.e. the initial potential, rises. As a result, the high potential Vhv rises and the level drop of the high potential Vhv is compensated.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A write circuit for supplying a write potential that is higher than a power supply potential to memory cells of a semiconductor memory device, comprising:
   a voltage-controlled oscillator (VCO) for receiving the power supply potential and generating an oscillation clock signal having an oscillation clock frequency that fluctuates in response to a reference potential;
   a reference potential generator, connected to the VCO, for generating the reference potential, wherein the reference potential generator maintains the reference potential at a substantially constant level such that the VCO generates the oscillation clock signal having a constant oscillation clock frequency;
   a booster, connected to the VCO, for generating the write potential by piling up the oscillation clock signal onto the power supply potential in a multistage manner; and
   a write controller, connected to said booster, for supplying the write potential to the memory cells in accordance with a write clock.

2. The write circuit of claim 1, wherein the VCO generates the oscillation clock signal and an inverse clock signal that is inverse of the oscillation clock signal, and wherein the booster includes a plurality of series connected transistors including odd and even stage transistors and a plurality of capacitors including odd and even stage capacitors;
   wherein the odd stage capacitors have a first terminal connected to the gate and the drain of the odd stage transistors and a second terminal that receives the oscillation clock signal, and the even stage capacitors have a first terminal connected to the gate and the drain of the even stage transistors and a second terminal that receives the inverse clock signal.

3. The write circuit of claim 2, wherein the booster further includes a diode having an anode connected to the source of the final stage transistor and a cathode connected to the ground potential.

4. A write circuit for supplying a write potential that is higher than a power supply potential to memory cells of a semiconductor memory device, comprising:
   a voltage-controlled oscillator (VCO) for receiving the power supply potential and generating an oscillation clock signal having an oscillation clock frequency that fluctuates in response to a reference potential;

a reference potential generator, connected to the VCO, for generating the reference potential, wherein the reference, potential generator maintains the reference potential at a substantially constant level such that the VCO generates the oscillation clock signal having a constant oscillation clock frequency;

a booster, connected to the VCO, for generating the write potential by piling up the oscillation clock signal onto the power supply potential in a multistage manner;

a write controller, connected to said booster, for supplying the write potential to the memory cells in accordance with a write clock; and a level shift circuit connected between the booster and the reference potential generator, for shifting the level of the write potential level to a lower level than the power supply potential to generate an intermediate potential provided to the reference potential generator.

5. The write circuit of claim 4, wherein the reference potential generator includes a pair of transistors connected in series between the power supply potential and ground potential, the intermediate potential is applied to the gate of one of the pair of transistors, and the reference potential is output from a node between the pair of the transistors.

6. A write circuit for supplying a write potential that is higher than a power supply potential to memory cells of a semiconductor memory device, comprising:

a voltage-controlled oscillator (VCO) for receiving the power supply potential and generating an oscillation clock signal having an oscillation clock frequency that fluctuates in response to a reference potential;

a reference potential generator, connected to the VCO, for generating the reference potential, wherein the reference potential generator maintains the reference potential at a substantially constant level such that the VCO generates the oscillation clock signal having a constant oscillation clock frequency;

a booster, connected to the VCO, for generating the write potential by piling up the oscillation clock signal onto the power supply potential in a multistage manner;

a write controller, connected to said booster, for supplying the write potential to the memory cells in accordance with a write clock; and a level shift circuit connected to the booster, for shifting the level of the write potential to a lower level than the power supply potential to generate an intermediate potential, wherein the booster generates the write potential based on the intermediate potential.

7. The write circuit of claim 6, wherein the VCO generates the oscillation clock signal and an inverse clock signal that is the inverse of the oscillation clock signal, and the booster includes a plurality of series connected first transistors including odd and even transistors, a plurality of capacitors including odd and even capacitors, and a second transistor;

wherein the odd stage capacitors have a first terminal connected to the gate and the drain of the odd stage first transistors and a second terminal that receives the oscillation clock signal;

the even stage capacitors have a first terminal connected to the gate and the drain of the even stage first transistors and a second terminal that receives the inverse clock signal; and the second transistor has its gate connected between the power supply potential and the first stage first transistor, for receiving the intermediate potential.

8. The write circuit of claim 7, wherein the reference potential generator comprises:

a resistor having a first terminal connected to the power supply potential and a second terminal;

a third transistor connected between the resistor second terminal and the ground potential, wherein a gate of the third transistor is connected to a first node N1 between the resistor and the third transistor; and a pair of transistors connected in series between the power supply potential and the ground potential, wherein a second node N2 between the transistor pair is connected to a gate of a first one of the pair of transistors and a gate of the second one of the pair of transistors is connected to the gate of the third transistor, and wherein a potential between the resistor and the third transistor is output at the first node N1 as a first reference potential and a potential between the transistor pair at the second node N2 is output as a second reference potential.

9. The write circuit of claim 1, wherein the reference potential generator comprises:

a resistor having a first terminal connected to the power supply potential and a second terminal;

a first transistor, connected between the resistor second terminal and a ground potential, wherein a gate of the first transistor is connected to a first node N1 between the resistor and the first transistor; and a pair of transistors connected in series between the power supply potential and the ground potential, wherein a second node N2 between the transistor pair is connected to a gate of a first one of the pair of transistors and a gate of the second one of the pair of transistors is connected to the gate of the first transistor, and wherein a potential between the resistor and the first transistor is output at the first node N1 as a first reference potential and a potential between the transistor pair at the second node N2 is output as a second reference potential.

10. A method of generating a write potential that is higher than a power supply potential to memory cells of a semiconductor memory device, comprising the steps of:

generating a reference potential;

generating an oscillation clock signal having an oscillation clock frequency that fluctuates in response to the reference potential;

generating a write potential by piling up the oscillation clock signal onto the power supply potential in a multistage manner; and supplying the write potential to the memory cells in accordance with a write clock, wherein the reference potential generating step includes maintaining the reference potential at a substantially constant level such that the oscillation clock signal having a constant oscillation clock frequency is generated in the oscillation clock signal generating step.

11. The method of claim 10, further comprising the steps of:

generating an intermediate level potential by shifting the level of the write potential to a level that is lower than the power supply potential; and maintaining the reference potential at a substantially constant level using the generated intermediate level potential.

* * * * *